United States Patent [19]

Rossiter

[11] Patent Number: 4,573,136
[45] Date of Patent: Feb. 25, 1986

[54] SUM-OF-PRODUCTS MULTIPLIER WITH MULTIPLE MEMORIES AND REDUCED TOTAL MEMORY SIZE

[75] Inventor: Timothy J. M. Rossiter, Sawbridgeworth, England

[73] Assignee: ITT Industries, Inc., New York, N.Y.

[21] Appl. No.: 429,953

[22] Filed: Sep. 30, 1982

[30] Foreign Application Priority Data

Oct. 27, 1981 [GB] United Kingdom ............... 8132315

[51] Int. Cl.$^4$ .............................................. G06F 7/52
[52] U.S. Cl. .................................... 364/728; 364/757
[58] Field of Search ............... 364/728, 757, 759, 760, 364/724

[56] References Cited

U.S. PATENT DOCUMENTS

| | | | |
|---|---|---|---|
| 3,761,699 | 9/1973 | Sather | 364/759 |
| 3,777,130 | 12/1973 | Croisier et al. | 364/724 |
| 3,919,535 | 11/1975 | Vattuone | 364/760 |
| 3,959,639 | 5/1976 | Köethmann | 364/760 |
| 4,142,242 | 2/1979 | Durochel et al. | 364/759 |
| 4,146,931 | 3/1979 | DelForge | 364/724 |
| 4,337,518 | 6/1982 | Ohnishi et al. | 364/724 |
| 4,423,488 | 12/1983 | Campbell | 364/724 |
| 4,450,533 | 5/1984 | Petit et al. | 364/724 |
| 4,484,299 | 11/1984 | Lambourn et al. | 364/724 |

*Primary Examiner*—David H. Malzahn
*Attorney, Agent, or Firm*—Donald J. Lenkszus

[57] ABSTRACT

In a sum-of-products multiplier, such as is used in a digital filter, it is desired to be able to produce the sum of a number of independent multiplications of binary numbers each representing a signal value, i.e.

$$v = \sum_{j=0}^{M-1} a_j \cdot u_j$$

where v is the sum of products, $u_j$ are the inputs and $a_j$ are weighting coefficients by which the inputs are to be multiplied. A known multiplier functions on the basis of precomputed weighting coefficients stored in a memory but this needs a very large memory and the pre-computation needs a complex device with many adders.

In the novel device the memory is split into two (or more) sub-memories between which the pre-computed coefficients are shared. The coefficients are extracted for use if an input digit is 1 (but not if it is 0) and are passed via an adder where they will add to the coefficients from the other sub-memory and passed to an accumulator/shifter whose content is shifted after each digit place and whose output is the sum of products. There are also other modes of operation which allow the coefficients to be updated while the multiplier is performing computations.

The overall saving in memory is considerable, and the computation device for the coefficient is much smaller than in the known devices. Thus the apparent extra complexity of the adder is more than counter-balanced by the reduced size of memory and other circuitry needed.

6 Claims, 4 Drawing Figures

SUM-OF-PRODUCTS MULTIPLIER WITH MULTIPLE MEMORIES AND REDUCED TOTAL MEMORY SIZE

BACKGROUND OF THE INVENTION

This invention relates to a sum-of-products multiplier, such as may be used in a digital filter in which a binary representation of an input signal has to be multiplied by coefficients of different sizes.

A sum-of-products multiplier is used where one wishes to form a sum of a number of independent multiplications, i.e.

$$v = \sum_{j=0}^{M-1} a_j u_j \quad (1)$$

where
v is the sum of products,
$u_j$ are the inputs and
$a_j$ are the coefficients
M is the number of coefficients or inputs.

Each of the inputs $u_j$ has to be multiplied by a respective coefficient $a_j$ and the resulting sub-products have to be added together to give an output.

If the inputs are represented by two's complement binary numbers they can be expressed as follows:

$$u_j = \sum_{k=0}^{N-1} u_{j,k} \cdot W_k \quad (2)$$

where
$u_{j,k}$ is the k'th bit of the j'th input,
$W_k$ is the k'th binary weight, and
N is the number of bits in a word. Note that the zero'th bit ($U_j,0$) is conventionally referred to as the least significant bit.

In the arrangement to be described herein the weights have the following values:

$$W_k = 2^{-(N-1-k)} \quad W_{N-1} = -1$$

where
k can take integer values in the range 0 to N−2. Thus for N=4 the following weights are used:

| K   | 3  | 2   | 1   | 0   |
|-----|----|-----|-----|-----|
| $W_k$ | −1 | ½  | ¼   | ⅛   |

Therefore 0.75 is represented as $0110 = \frac{1}{2} + \frac{1}{4}$ and −0.625 is represented as $1011 = -1 + \frac{1}{4} + \frac{1}{8}$. The data words $u_j$ are represented by bit-serial binary data streams with the least significant bit ($U_j,0$) first.

At this point it is convenient to describe a single coefficient multiplier, i.e. the degenerate case with M=1 and j=0, in which case the summation is represented by $$v = \sum_{k=0}^{N-1} W_k (u_{0,k} \cdot a_0) \quad (3)$$

This shows that v can be formed by accumulating weighted multiples of the coefficient value $a_0$.

BRIEF DESCRIPTION OF THE DRAWINGS

As shown in FIG. 1, which is a simple representation of a single coefficient multiplier, the accumulation is done by an accumulator, the weighting being effected by right-shifting by one place the contents of the accumulator 19 after each accumulation. Such a right-shift halves the values of the contents of the accumulator. During each accumulation, the relevant bit of the input word $u_{0,k}$ controls a gate 11 such that if that bit is 1, the coefficient $a_0$ is added into the accumulator 19 from a coefficient store 12, whereas if that digit is 0, the gate 11 supplies a zero value. The negative sign of the greatest significant weight $W_{N-1}$ is allowed for by subtracting, rather than adding, the output of the gate 11 during the last accumulation, as controlled by the accumulator's add/subtract line.

Figure 1:
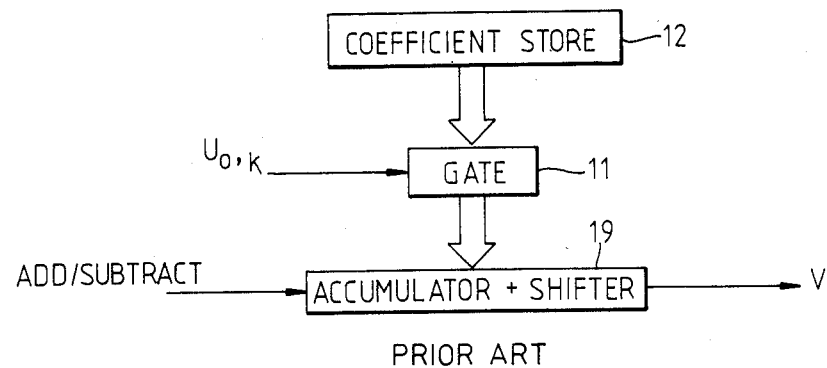
FIG. 1 illustrates a simplified block diagram of a single coefficient multiplier.

The basic principle represented by the circuit of FIG. 1 can be extended to produce a sum of products multiplier, for which the equation is $$v = \sum_{k=0}^{N-1} W_k \sum_{j=0}^{M-1} u_{j,k} \cdot a_j \quad (4)$$

To consider the inner summation of equation (4), for each value of k it can only take one of a set of $2^M$ possible values, which set is usable for all values of k. These values correspond to the $2^M$ possible combinations of the binary variables $u_{0,k}, u_{1,k} \ldots u_{M-1,k}$. Thus the inner summation can only take one of a relatively small finite set of values, which can be precomputed and stored in a memory.

Figure 2:
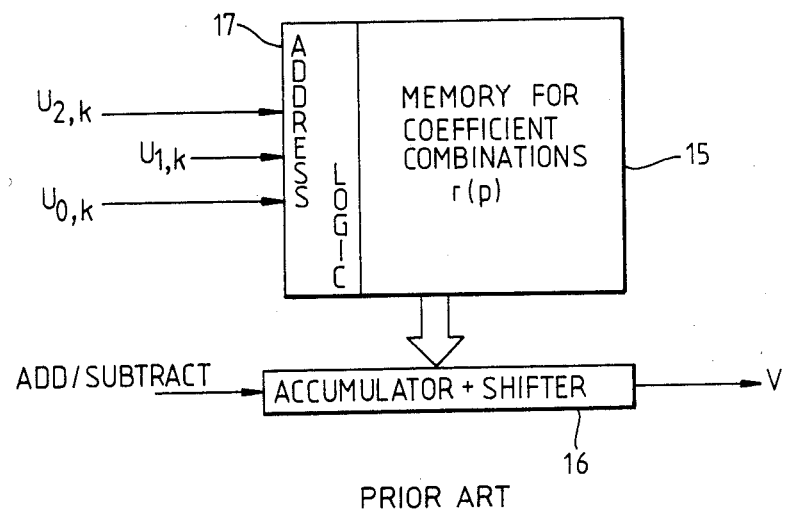
FIG. 2 illustrates a known sum-of-products multiplier.

FIG. 2 shows in basics a known sum-of-products multiplier, which has a memory 15 for the coefficient combinations, with its address logic feeding an accumulator plus shifter 16. The multiplier operates by causing the input data [$u_{j,k}$] to select coefficient combinations in the memory 15, via the address logic 17.

During the k'th bit period, the M bit values $u_{0,k} \ldots u_{M-1,k}$ form an M-bit binary word which is used to select a particular location in the memory 15. The value of the coefficient combination in that location is then passed to the accumulator and shifter 16. Note that usually different and unrelated locations will be accessed in subsequent bit periods.

Thus if the contents of the p'th memory location is r(p), and p is calculated as $$p = \sum_{j=0}^{M-1} 2^j \cdot u_{j,k} \text{ where } u_{j,k} \text{ can take the values 0 or 1.} \quad (5)$$

then the value of r(p) must be so chosen that $$r(p) = \sum_{j=0}^{M-1} u_{j,k} \cdot a_j$$

This is illustrated in the following table for the simple case where M=3.

| $u_{2,k}$ | $u_{1,k}$ | $u_{0,k}$ | p | r(p) |
|---|---|---|---|---|
| 0 | 0 | 0 | 0 | 0 |
| 0 | 0 | 1 | 1 | $a_0$ |
| 0 | 1 | 0 | 2 | $a_1$ |
| 0 | 1 | 1 | 3 | $a_1 + a_0$ |
| 1 | 0 | 0 | 4 | $a_2$ |
| 1 | 0 | 1 | 5 | $a_2 + a_0$ |
| 1 | 1 | 0 | 6 | $a_2 + a_1$ |
| 1 | 1 | 1 | 7 | $a_2 + a_1 + a_0$ |

Thus the memory locations are accessed as if binary weights had to be assigned to the $u_{j,k}$ bits. When one of those bits is 1, the corresponding coefficient $a_j$ is included in the sum of coefficients constituting the value in the referenced location.

Substituting equation (5) in equation (4), we get $$v = \sum_{k=0}^{N-1} W_k \, r(p) \quad (7)$$

Note that the two-valued term ($u_{0,k} \cdot a_0$) of equation (3), is replaced by the term r(p) which may have any one of $2^M$ values. Thus in the arrangement of FIG. 2, the coefficient store is replaced by a $2^M$ word memory for the coefficient combinations [r(p)]. The words are selected from the memory 15 by using the data inputs $u_{j,k}$ to drive the address logic 17.

The above arrangement in fact needs a great deal of memory, plus associated circuitry, and it is an object of the invention to provide an arrangement which greatly reduces the amount of memory, etc. needed.

According to the invention there is provided a sum-of-products multiplier, for forming the sum of a number of independent multiplications, as defined by the equation $$v = \sum_{k=0}^{N-1} W_k \sum_{j=0}^{M-1} u_{j,k} \cdot a_j$$

where v is the sum of products,
$u_{j,k}$ is the k'th binary digit of the j'th input
$a_j$ are the coefficients to be used for the multiplications,
M is the number of inputs to the multiplier involved in a sum-of-products multiplications,
N is the number of binary weights used in the determination of said coefficients and
$W_k$ is the k'th of said binary weights, wherein for each value of k the inner summation of said equation can taken any one of $2^M$ possible values which are usable for all values of k, said values corresponding to the $2^M$ possible combinations of the binary variables $u_{0,k}, u_{1,k}, \ldots u_{M-1,k}$, wherein memory means is provided in which said set of combinations to be used for the multiplications is stored, which memory means includes a plurality of sub-memories each of which can contain a selection of the coefficient combinations to be used, wherein selection means controlled by the respective bits [$u_{j,k}$] of the input numbers select the coefficient combinations to be read-out for those bits, said read-outs being effected for different said bits from different sub-memories, wherein the outputs from said sub-memories are applied to an adder, wherein the result of summation in said adder is applied to an accumulator/shifter with the accumulation being shifted according to bits [$u_{j,k}$], and wherein an add/subtract control is provided for the accumulator/shifter whereby the coefficient combination associated with a positive weight of the input bits $u_{j,k}$ is added to the contents of the accumulator and the coefficient combination associated with a negative weight of the input bits [$u_{j,k}$] is subtracted from the contents of the accumulator, so that the required sum of products is derived from the output of the multiplier/shifter.

DESCRIPTION OF THE PREFERRED EMBODIMENT

Embodiments of the invention will now be described with reference to the accompanying FIGS. 3 and 4.

Figure 3:
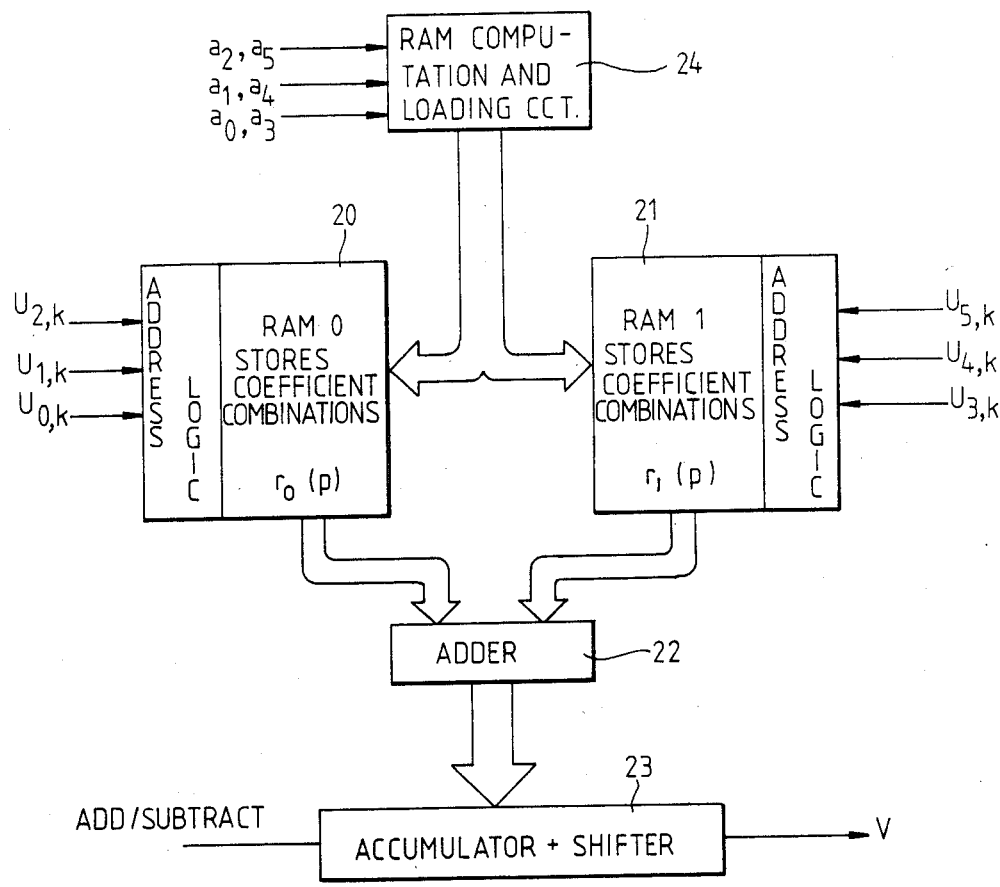
FIG. 3 illustrates a sum-of-products multiplier having two random access memories.
Figure 4:
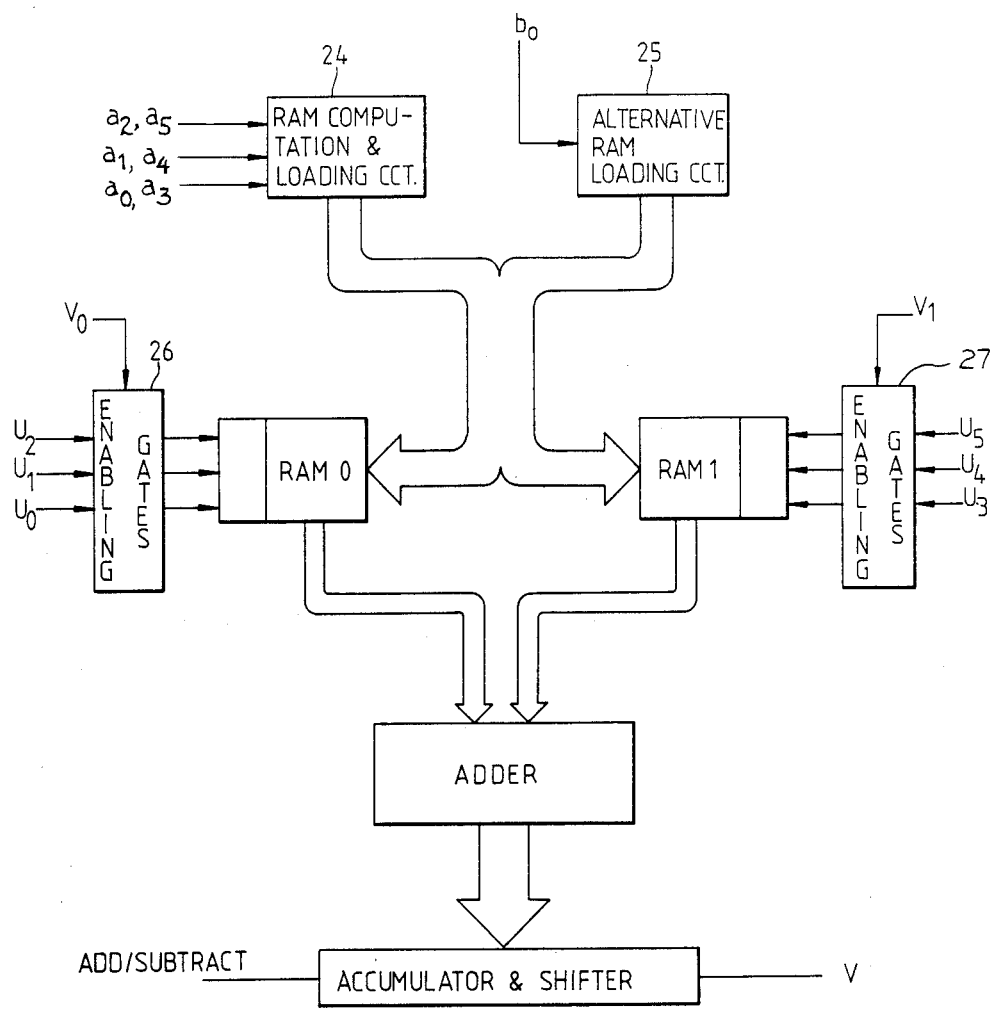
FIG. 4 illustrates a further and improved embodiment of the sum-of-products multiplier of FIG. 3.

FIG. 3 shows a sum-of-products multiplier with two random access memories or RAMs 20, 21 each containing half of the coefficient combinations, with half of the inputs' controls exercised on each. The RAM outputs go via an adder 22 to the accumulator and shifter 23. The coefficient combinations are generated and loaded into the memories 20 and 21 from the RAM computation and loading circuit 24, controlled by the various coefficients $a_0, a_1, \ldots a_5$.

Thus the main difference between the arrangement of FIG. 3 and the known arrangement of FIG. 2 is that the single memory of FIG. 2 is replaced by two smaller memories 20, 21, whose outputs are added by the adder 22 before feeding the accumulator/shifter. Note that the memory may be split in a similar manner into more than two "sub-memories".

The validity of using multiple smaller memories is demonstrated by re-arranging equation 4 as:

$$v = \sum_{k=0}^{N-1} W_k \left( \sum_{j=0}^{M/2-1} u_{j,k} \cdot a_j + \sum_{j=M/2}^{M-1} u_{j,k} \cdot a_j \right) \quad (8)$$

M is assumed to be an even number, but M can also be odd, in which case the sub-memories are of different sizes, and the summation limits are suitably adjusted.

What equation (8) means is that two smaller memories can be used each to store half of the various coefficient combinations, the outputs of the two memories being added before being passed to the accumulator/shifter. The coefficient combinations to be used are computed from the respective coefficients $a_0$ to $a_5$ by the unit 24.

The multiplier of FIG. 2, needs $2^M$ memory words while that of FIG. 3 needs $2 \times 2^{M/2}$. For instance, if M=6, then 64 words of memory are needed, whereas in FIG. 3, only 16 words of memory are needed. There are also savings in the logic needed to address the memories and in the logic needed to compute the combinations of coefficients loaded into the memory. Thus a device such as FIG. 2 needs $2^M - (M+1)$ adders whereas that of FIG. 3 only needs $2^{M/2} - (M/2+1)$ adders. For instance, where M=6, the arrangement of FIG. 2 needs 57 adders, and that of FIG. 3 needs only 4 adders.

The adder 22 plus certain other logic is additional to FIG. 2, but the savings just indicated more than counter-balance those additions to the equipment.

A shortcoming of the basic sum-of-products multiplier of FIG. 3 is that it is not possible to alter the values of the coefficients without interrupting the normal operation of the multiplier. This shortcoming can be removed if a small amount of extra logic is added to the multiplier shown in FIG. 3. The extra logic is shown in FIG. 4 and comprises two sets of enabling gates 26 and 27 and some alternative RAM loading logic 25. These are used to give the following four operational modes.

Mode 1

This is the basic operational mode at the sum-of-products multiplier, in which the outputs of both RAM's are added together (as described in preceeding paragraphs). This is accomplished by using the normal RAM loading logic 24 and turning on both enabling gates 26 and 27.

Mode 2

In this mode the normal RAM loading logic 24 is used, but the enabling gates 26 and 27 are so controlled that one is on while the other is off. The effect of turning an enabling gate off is to force the RAM address logic to select RAM entry $r_0(0)$ or $r_1(0)$, this entry being defined to be zero. Thus when gate 0 is turned off the output of the adder 22 is $0+r_1(p)$, similarly when gate 1 is turned off the output of the adder is $0+r_0(p)$, in other words the computation is unaffected by the contents of the RAM that is not enabled. Thus it is possible to update the contents of RAM 0 whilst performing computations using the contents of RAM 1, when RAM 0 has been fully updated it is then possible to enable RAM 0, inhibit RAM 1 and so use the new contents of RAM 0 whilst RAM 1 is updated.

This mode of operation halves the number of available inputs to the multiplier, but it does allow the multiplier coefficients to be changed to new values for each new computation whilst the multiplier is performing uninterrupted computations.

Modes 3 and 4

In modes 3 and 4 the alternative RAM loading logic is used. Mode 3 operates with the enabling gates 26 and 27 both on, mode 4 operates with alternative enabling gates being turned on. Summarize the above comments on the modes, in modes 1 and 2 the contents of each RAM location are determined by the coefficient values ($a_j$) and the following relationship $$r(p) = \sum_{j=0}^{M-1} u_{j,k} \cdot a_j$$

On the other hand modes 3 and 4 provide a greater degree of freedom by allowing the contents of all memory locations r(p) to be independently determined. In this case only one data input is provided per RAM ($v_0$, $v_1$) and they are weighted by the values of $r_0(p)$, $r_1(p)$ (respectively) as selected by the other 'data' inputs ($u_0$, $u_1$, $u_2$), and ($u_3$, $u_4$, $u_5$). The advantage of this is that, although it may take a number of computational cycles to entirely re-load the contents of a RAM it is, however, possible to instantly select one particular value r(p) from the set of values stored in the RAM. The input data ($v_0$, $v_1$) in modes 3 and 4 is fed to the RAM enabling gates. Thus when a data digit is 0, the RAM value r(0) is added into the accumulator, this value is always 0. When a data digit is 1 the particular RAM value r(p) as selected by ($u_0$, $u_1$, $u_2$) or ($u_3$, $u_4$, $u_5$) is added into the accumulator. In this manner the inputs $v_0$, $v_1$ are weighted by the selected RAM values $r_0(p_0)$, $r_1(p_1)$.

Mode 3

In mode 3 both enabling gates 26 and 27 are turned on (except when turned off by 0 digits in the input data). The multiplier then computes:

$$v_0 \cdot r_0(p_0) + v_1 \cdot r_1(p_1)$$

In this mode it is not possible to change a set of coefficients r(p) without interrupting the multiplier operation.

Mode 4

In mode 4 the enabling gates 26 and 27 may be alternately turned on and off (as in mode 2), in which case the multiplier computes:

$$v_0 \cdot r_0(p_0) \text{ or } v_1 \cdot r_1(p_1)$$

It is then possible to update the contents of the inhibited RAM whilst the enabled one is being used for computation. In this manner the set of coefficients r(p) available can be changed without interrupting the operation of the multiplier.

I claim:

1. A sum-of-products multiplier for deriving the sum of a number of independent multiplications, represented by digital data, comprising:
a plurality of separately addressable random access memory means for storing a plurality of precomputed digital data representations of weighting coefficients by which input binary numbers are to be multiplied;
addressing means for addressing and extracting said stored precomputed digital representations from said plurality of separately addressable random access memories in response to applied input bits;
adder means coupled to said memory means for selectively adding said extracted stored precomputed digital representations from said memories together;
accumulator means coupled to said adder means for accumulating outputs from said adder means, said accumulating means including shifter means for shifting the content of said accumulator means such that the output thereof is the sum-of-products; and
updating means coupled to said memory means for updating the precomputed digital data in said memory means.

2. A sum-of-products multiplier in accordance with claim 1 wherein said plurality of memory means comprises two sub-memories.

3. A sum-of-products multiplier in accordance with claim 1 wherein said updating means is arranged for updating said precomputed digital data during the operation of said multiplier.

4. A sum of products multiplier as defined in claim 1 including means for controlling said accumulating of sums or differences in response to an associated positive weight or an associated negative weight of said applied input bits.

5. A sum of products multiplier as defined in claim 4 wherein said accumulating means includes means for summing coupled to said memory means.

6. A sum-of-products multiplier as defined in claim 1 further including an enabling gate coupled to each of said memory means for selectively applying said applied input bits to said memory means.

* * * * *